US012734562B2

(12) United States Patent
Kobayashi et al.

(10) Patent No.: US 12,734,562 B2
(45) Date of Patent: Sep. 15, 2026

(54) VACUUM PROCESSING DEVICE AND FOREIGN MATTER EJECTION METHOD

(71) Applicant: Hitachi High-Tech Corporation, Tokyo (JP)

(72) Inventors: Taiki Kobayashi, Tokyo (JP); Seiichiro Kanno, Tokyo (JP); Go Miya, Tokyo (JP); Yuuta Yanbe, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 142 days.

(21) Appl. No.: 18/843,453

(22) PCT Filed: Mar. 14, 2022

(86) PCT No.: PCT/JP2022/011430

§ 371 (c)(1),
(2) Date: Sep. 3, 2024

(87) PCT Pub. No.: WO2023/175689

PCT Pub. Date: Sep. 21, 2023

(65) Prior Publication Data

US 2025/0170623 A1 May 29, 2025

(51) Int. Cl.
*B08B 9/00* (2006.01)
*B08B 13/00* (2006.01)
(Continued)

(52) U.S. Cl.
CPC ................ *B08B 9/00* (2013.01); *B08B 13/00* (2013.01); *G05B 15/02* (2013.01); *H10P 72/0402* (2026.01)

(58) Field of Classification Search
None
See application file for complete search history.

(56) References Cited

U.S. PATENT DOCUMENTS

2005/0087136 A1 4/2005 Moriya et al.
2005/0241770 A1 11/2005 Moriya et al.
(Continued)

FOREIGN PATENT DOCUMENTS

JP 7-161598 A 6/1995
JP 8-321447 A 12/1996
(Continued)

OTHER PUBLICATIONS

JP-2016167431 English translation, accessed in Mar. 2026. (Year: 2016).*

(Continued)

*Primary Examiner* — Kaj K Olsen
*Assistant Examiner* — Arlyn I Rivera-Cordero
(74) *Attorney, Agent, or Firm* — Crowell & Moring LLP

(57) ABSTRACT

A vacuum processing apparatus includes a computer system, a transport unit configured to transport a sample, a vacuum sample chamber where the sample is processed in a vacuum, and a preliminary exhaust chamber into which the sample is loaded before being transported to the vacuum sample chamber. A partition wall is disposed between the vacuum sample chamber and the preliminary exhaust chamber. The computer system controls an operation of the partition wall to close a gap between the vacuum sample chamber and the preliminary exhaust chamber.

14 Claims, 9 Drawing Sheets

(51) Int. Cl.
*G05B 15/02* (2006.01)
*H10P 72/00* (2026.01)

(56) References Cited

U.S. PATENT DOCUMENTS

2010/0202093 A1 8/2010 Yamawaku et al.
2018/0233328 A1 8/2018 Ueda et al.

FOREIGN PATENT DOCUMENTS

JP 2002-353086 A 12/2002
JP 2005-116823 A 4/2005
JP 4450371 B2 4/2010
JP 2010-183005 A 8/2010
JP 4679813 B2 5/2011
JP 2016167431 A * 9/2016 .............. H01J 37/20
TW 201834060 A 9/2018

OTHER PUBLICATIONS

International Search Report (PCT/ISA/210) issued in PCT Application No. PCT/JP2022/011430 dated May 24, 2022, with English translation (4 pages).
Japanese-language Written Opinion (PCT/ISA/237) issued in PCT Application No. PCT/JP2022/011430 dated May 24, 2022, with English translation ( 9 pages).
Chinese-language Office Action issued in Taiwanese Application No. 112109151 dated Nov. 8, 2023 (9 pages).

* cited by examiner

[FIG. 1]
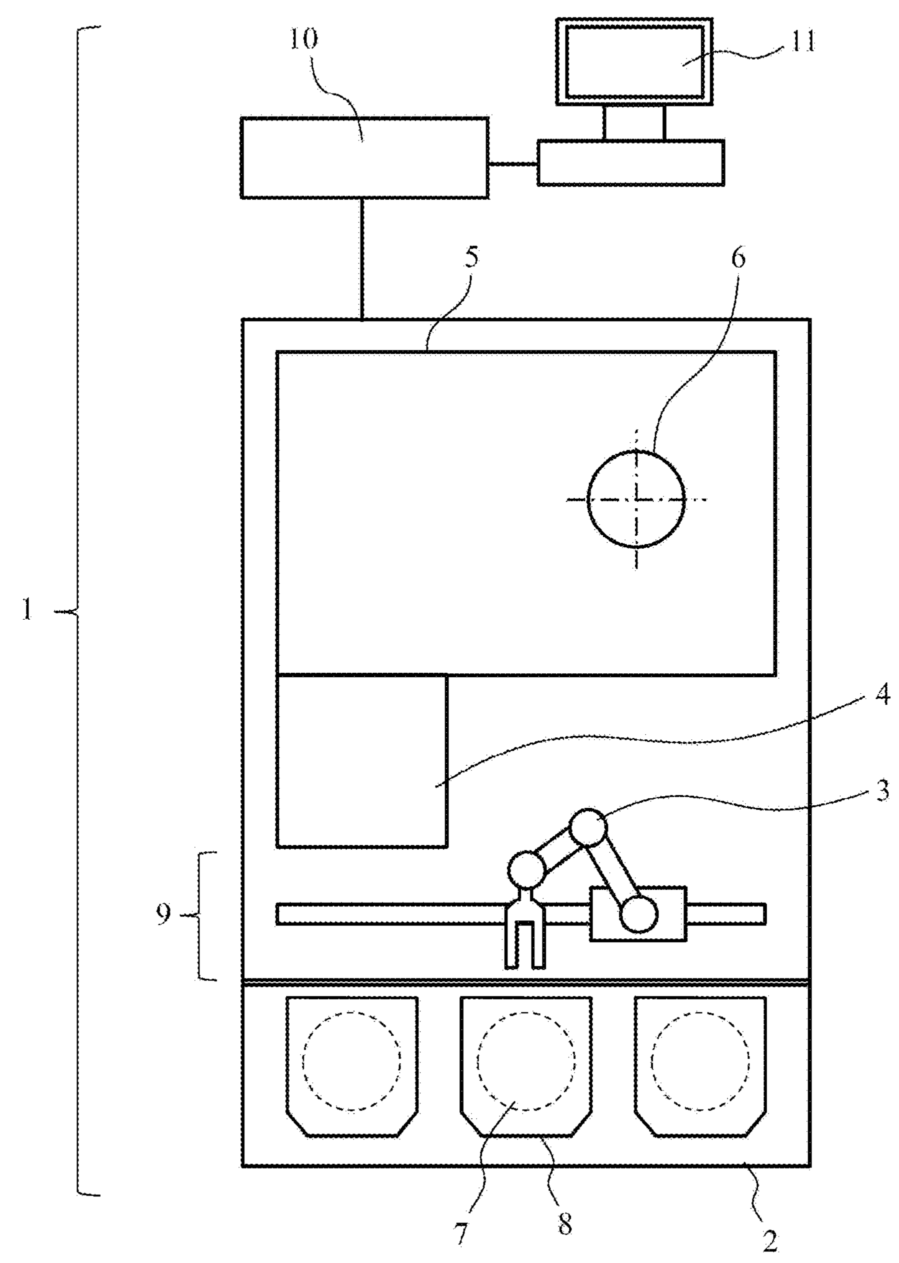

[FIG. 2]
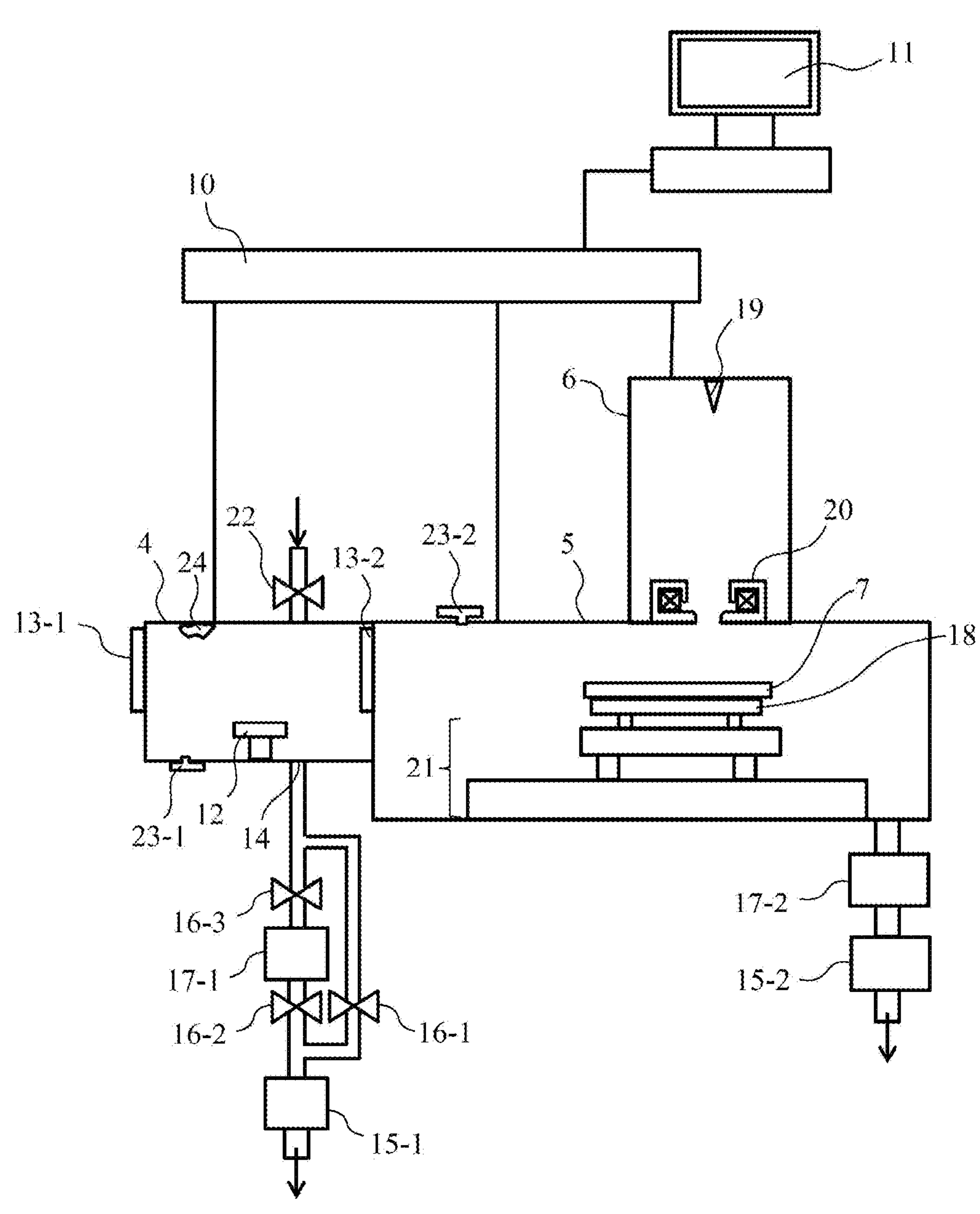

[FIG. 3]
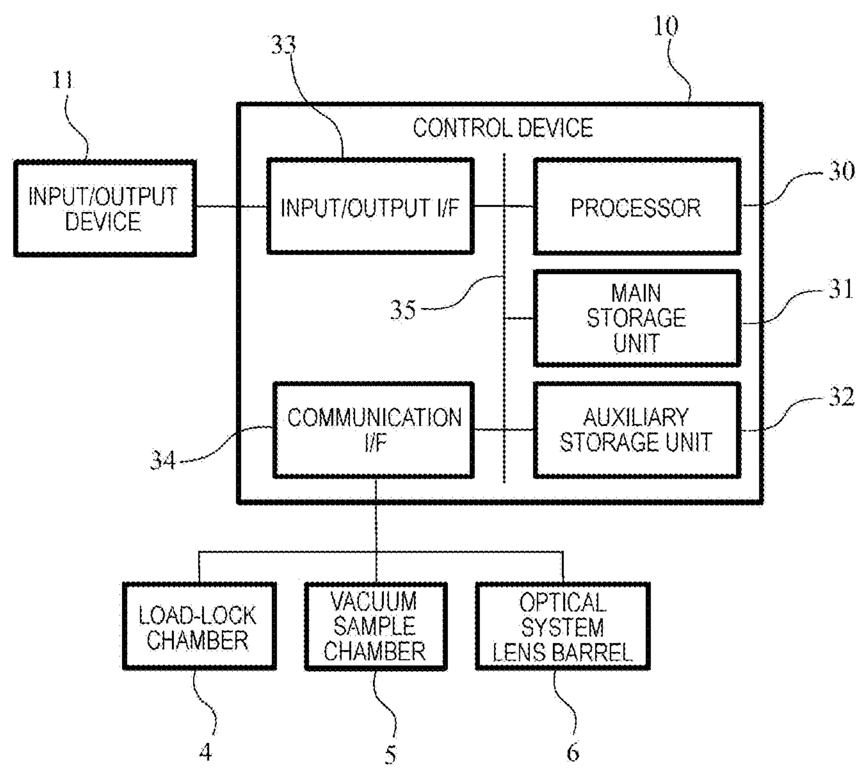

[FIG. 4]
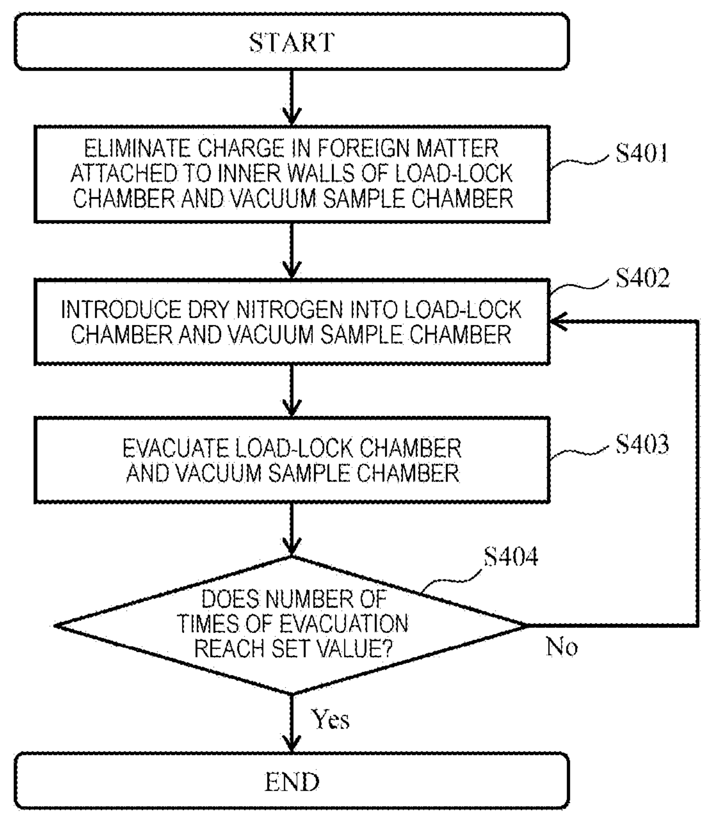

[FIG. 5]
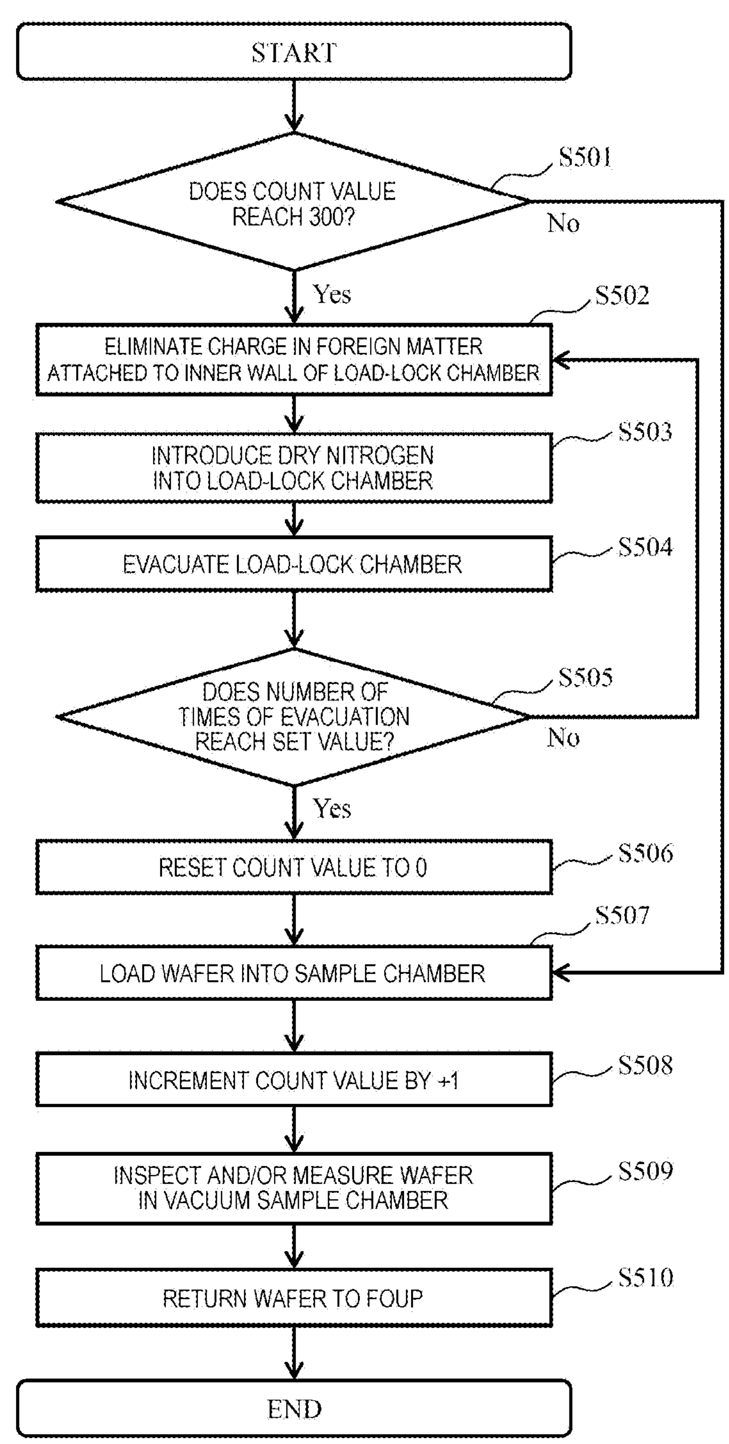

[FIG. 6]
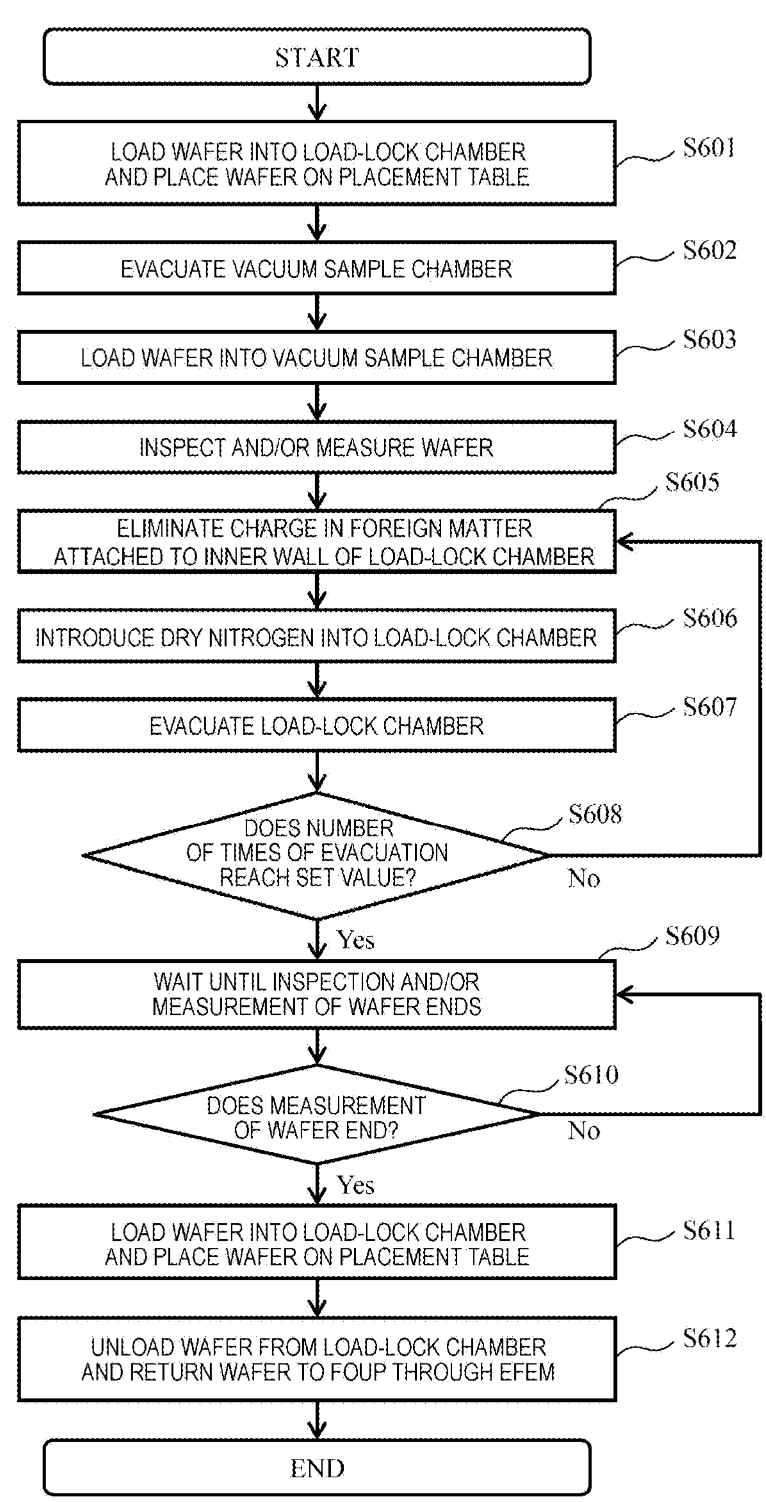

[FIG. 7]
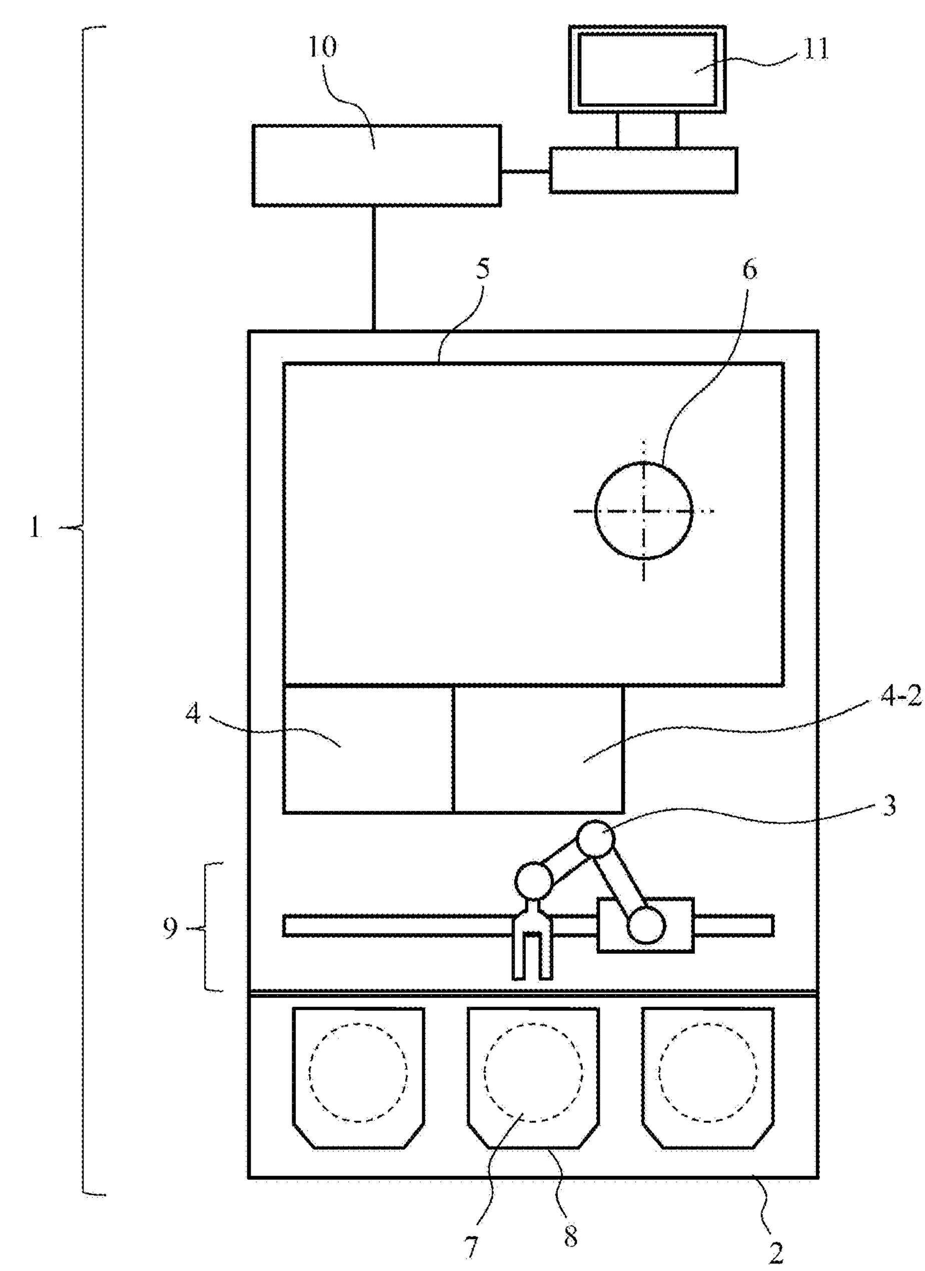

[FIG. 8]
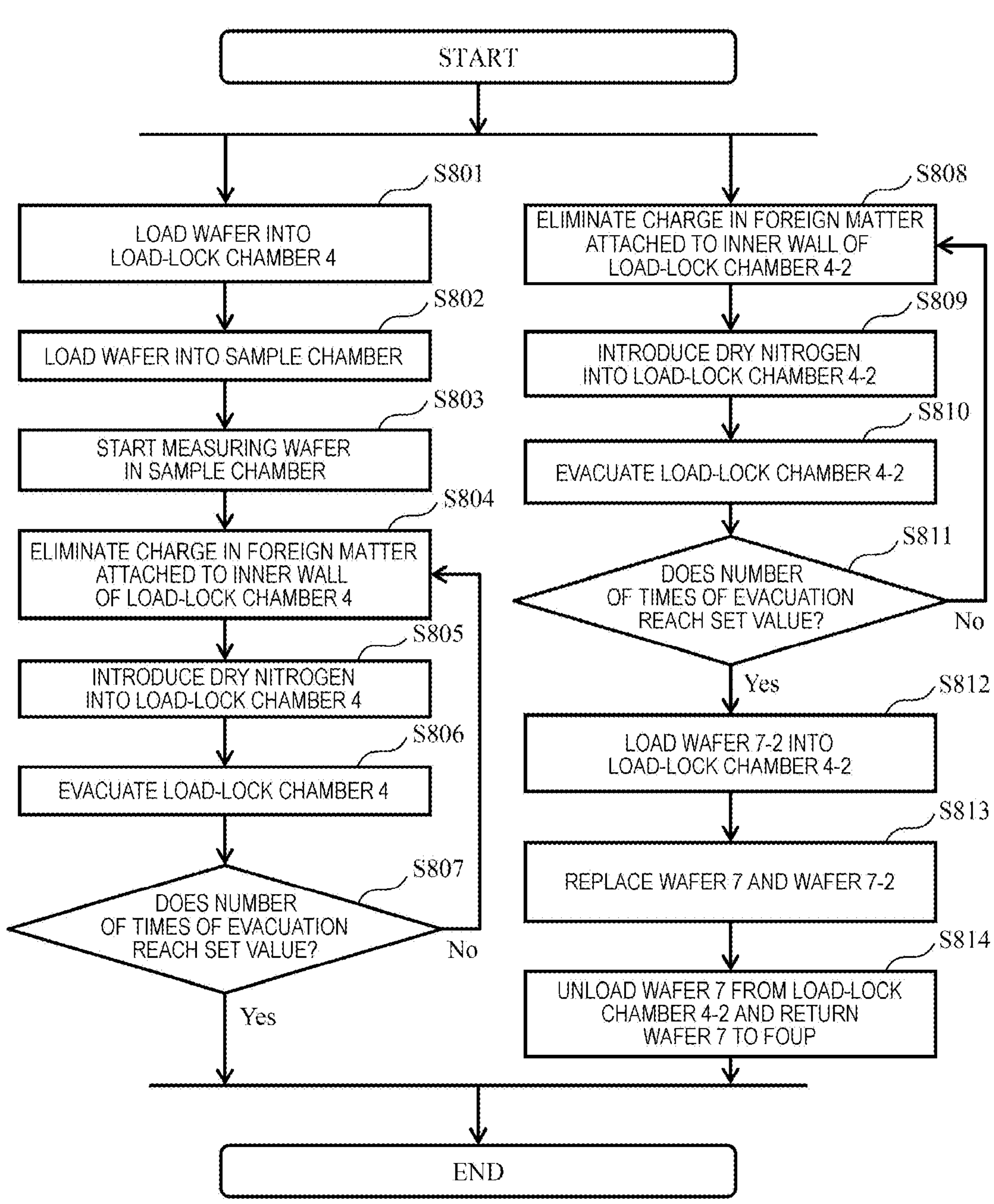

[FIG. 9]
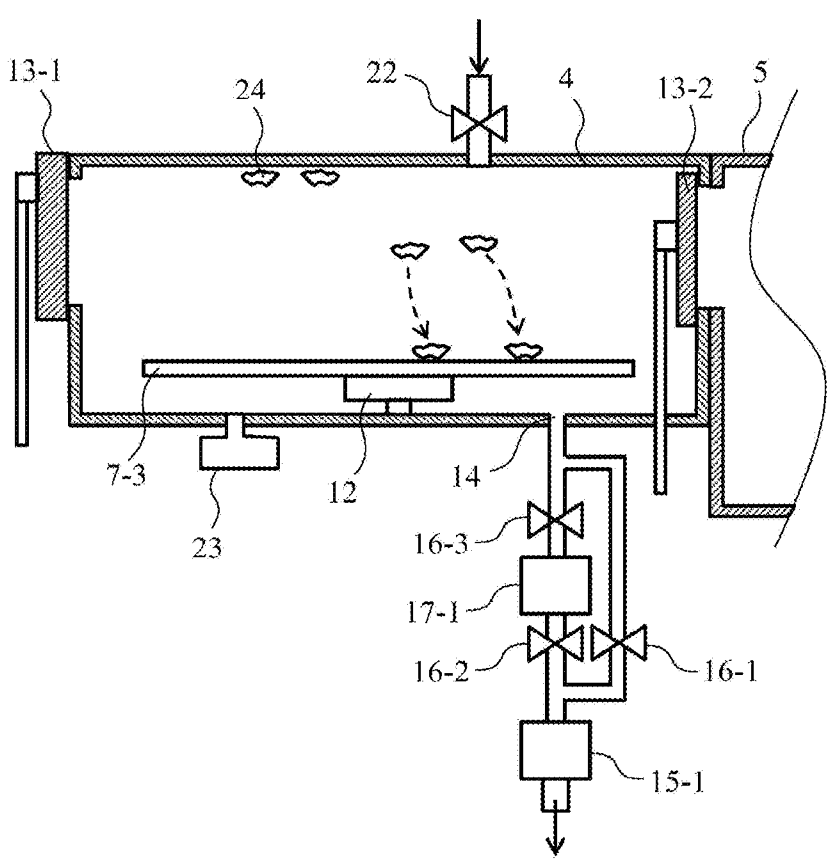

VACUUM PROCESSING DEVICE AND FOREIGN MATTER EJECTION METHOD

TECHNICAL FIELD

The present disclosure relates to a vacuum processing apparatus and a foreign matter discharge method, and relates to a vacuum processing apparatus and a foreign matter discharge method in which foreign matter attached to an inner wall of at least one of a preliminary exhaust chamber or a vacuum sample chamber can be discharged.

BACKGROUND ART

In manufacturing of a device formed of a semiconductor or the like, in order to measure, for example, a dimension of a contact hole between various wirings, gate electrodes, and wiring layers, a measurement apparatus such as a CD-SEM (Critical-Dimension Scanning Electron Microscope) using an electron beam is used as one configuration of an application apparatus of a charged particle beam apparatus.

A sample as a measurement target in the CD-SEM is a wafer formed of a semiconductor or the like, and a plurality of rectangular chips are formed substantially in the entire region of the sample. A semiconductor device is refined and complicated for improving device performance and circuit performance. As a result, a demand for reducing foreign matter that causes a decrease in the yield of a semiconductor device has increased as compared to the related art.

When foreign matter is attached to the wafer, the yield of a semiconductor device may decrease. Therefore, in a semiconductor device mass-production line using a process apparatus such as an etching apparatus or a semiconductor inspection and measurement apparatus that inspects or measures a semiconductor device, a sample such as a bare wafer is loaded into the apparatuses, and the number of foreign matters increased before and after the loading is regularly checked. Due to the regular check, it is verified that the process apparatus or the semiconductor inspection and measurement apparatus is clean and the risk of attachment of foreign matter to a wafer used for manufacturing a semiconductor device is small.

One example of the foreign matter that causes a problem during use of the semiconductor inspection and measurement apparatus or the process apparatus is dust generated from a slide unit of the apparatuses. In addition, in another example, when a wafer to which foreign matter is attached in a step before a step where the process apparatus or the semiconductor inspection and measurement apparatus is used is brought into the process apparatus or the semiconductor inspection and measurement apparatus, there is a case where the foreign matter may be separated from front and back surfaces of the wafer due to some reason to accumulate in a vacuum sample chamber or a load-lock chamber of the semiconductor inspection and measurement apparatus or the process apparatus. The foreign matter floats in the vacuum sample chamber or the load-lock chamber or is attached to an inner wall of the vacuum sample chamber or the load-lock chamber.

CITATION LIST

Patent Literature

PTL 1: JP4679813B
PTL 2: JP4450371B

SUMMARY OF INVENTION

Technical Problem

The foreign matter attached to the surface of the wafer causes a decrease in the yield of a semiconductor device. Therefore, it is desired to reduce foreign matter in the vacuum sample chamber or the load-lock chamber of the semiconductor inspection and measurement apparatus or the process apparatus.

In order to solve the problem, PTL 1 discloses a particle attachment prevention device including: a particle charger configured to charge foreign matter such as particles in a vacuum sample chamber or a preliminary exhaust chamber; and an electric field forming device configured to form an electric field having the same polarity as a charging polarity of particles in a wafer that is provided in the chamber.

In the technique disclosed in PTL 1, particles charged by the particle charger can be prevented from being attached to a member such as a processing chamber having the same polarity, and foreign matter attached to the inner wall of the vacuum sample chamber or the load-lock chamber is not mentioned at all.

In addition, in order to solve the above-described problem, PTL 2 discloses a technique of discharging foreign matter by generating an electric field between a substrate to be processed and a table in a processing chamber where plasma etching is executed, separating the foreign matter attached to the substrate, and supplying and discharging gas to and from the processing chamber. This technique is effective for discharging the foreign matter attached to the substrate. However, the foreign matter attached to the inner wall of the vacuum sample chamber or the load-lock chamber is not mentioned at all.

Accordingly, an object of the present disclosure is to provide a vacuum processing apparatus and a foreign matter discharge method in which foreign matter attached to an inner wall of a vacuum sample chamber or a load-lock chamber can be reduced.

Solution to Problem

In order to solve the problem, a vacuum processing apparatus according to the present disclosure includes: a transport unit configured to transport a sample; a vacuum sample chamber where the sample is processed in a vacuum; a preliminary exhaust chamber into which the sample is loaded before being transported to the vacuum sample chamber; a static charge eliminator configured to eliminate charge in foreign matter attached to an inner wall of at least one of the preliminary exhaust chamber or the vacuum sample chamber; a nitrogen supply line configured to supply nitrogen to the preliminary exhaust chamber and the vacuum sample chamber; a vacuum pump configured to evacuate the preliminary exhaust chamber and the vacuum sample chamber; and a computer system configured to control the transport unit, the static charge eliminator, the vacuum pump, and the nitrogen supply line to execute the charge elimination in the foreign matter attached to the inner wall, the nitrogen supply, and the evacuation in at least one of the preliminary exhaust chamber or the vacuum sample chamber.

Advantageous Effects of Invention

According to the present disclosure, foreign matter attached to an inner wall of a vacuum sample chamber or a load-lock chamber can be reduced.

Objects, configurations, and effects other than those described above will be clarified by describing the following embodiments.

BRIEF DESCRIPTION OF DRAWINGS

FIG. 1 is a top view illustrating an overall configuration of a semiconductor measurement and inspection apparatus according to a first embodiment.

FIG. 2 is a side sectional view illustrating a configuration of a load-lock chamber and a vacuum sample chamber in the semiconductor measurement and inspection apparatus according to the first embodiment.

FIG. 3 is a block diagram illustrating hardware of a control device according to the first embodiment.

FIG. 4 is a flowchart illustrating a method of removing foreign matter attached to inner walls of the load-lock chamber and the sample chamber according to the first embodiment.

FIG. 5 is a flowchart illustrating a method of removing foreign matter attached to the inner wall of a load-lock chamber according to a second embodiment.

FIG. 6 is a flowchart illustrating a method of removing foreign matter attached to the inner wall of a load-lock chamber according to a third embodiment.

FIG. 7 is a top view illustrating an overall configuration of a semiconductor measurement and inspection apparatus including a plurality of load-lock chambers according to a fourth embodiment.

FIG. 8 is a flowchart illustrating a method of removing foreign matter attached to inner walls of the plurality of load-lock chambers according to the fourth embodiment.

FIG. 9 is a cross-sectional view illustrating a load-lock chamber into which a wafer is loaded in a fifth embodiment.

DESCRIPTION OF EMBODIMENTS

Embodiments of the present disclosure will be described in detail based on the drawings. In the following embodiments, it goes without saying that configurations thereof (including steps of a flowchart) are not necessarily required, unless expressly stated otherwise and unless they are considered to be clearly required in principle or other reasons. Hereinafter, preferred embodiments of the present disclosure will be described using the drawings.

First Embodiment

Hereinafter, a semiconductor measurement and inspection apparatus according to a first embodiment will be described using FIGS. 1 to 4.

FIG. 1 is a top view illustrating an overall configuration of the semiconductor measurement and inspection apparatus according to the first embodiment, and FIG. 2 is a side sectional view illustrating a configuration of a load-lock chamber and a vacuum sample chamber in the semiconductor measurement and inspection apparatus according to the first embodiment.

As illustrated in FIGS. 1 and 2, a semiconductor measurement and inspection apparatus 1 using an SEM (Scanning Electron Microscope) type optical system includes an FOUP (Front-Opening Unified Pods) loader 2, a transport robot 3, a load-lock chamber 4, a vacuum sample chamber 5, an optical system lens barrel 6, a control device 10 that controls the above-described units, and an input/output device 11. A wafer 7 that is a sample to be measured and/or to be inspected by the semiconductor measurement and inspection apparatus 1 is stored in a container that is generally called FOUP. One or a plurality of FOUP's 8 are set in the FOUP loader 2. A module that is generally called an EFEM (Equipment Front End Module) is provided adjacent to the FOUP loader 2. The transport robot 3 provided in the EFEM 9 takes out the wafer 7 from the FOUP 8, and loads the wafer 7 into the load-lock chamber 4. The transport robot 3 is a transport unit that transports the sample. A door valve 13-1 is provided on the EFEM 9 side of the load-lock chamber 4, when the wafer 7 is loaded into the load-lock chamber 4, the door valve 13-1 is opened, and the wafer 7 is placed on a placement table 12 in the load-lock chamber 4 by the transport robot 3. The load-lock chamber 4 is a preliminary exhaust chamber into which the wafer 7 is loaded before being transported to the vacuum sample chamber 5.

After the wafer 7 is placed on the placement table 12, the inside of the load-lock chamber 4 is adjusted to enter a reduced pressure state and evacuated in the following procedure. In the initial state, door valves 13-1 and 13-2 and valves 16-1 to 16-3 are closed, and the inside of the load-lock chamber 4 is in the atmospheric pressure state. First, by opening the valve 16-1 provided in a pipe between the load-lock chamber 4 and a dry pump 15-1, gas in the load-lock chamber 4 is slowly exhausted from an exhaust port 14. Next, the valve 16-1 is closed, and the valve 16-2 provided in a pipe between the dry pump 15-1 and a turbomolecular pump 17-1 is opened. Next, the valve 16-3 provided in a pipe between the load-lock chamber 4 and the turbomolecular pump 17-1 is opened. Through the above-described operation, the inside of the load-lock chamber 4 is evacuated by the dry pump 15-1 and the turbomolecular pump 17-1 to be in a reduced pressure state in the order of $10^{-4}$ Pa.

During the operation of the semiconductor measurement and inspection apparatus 1, the inside of the vacuum sample chamber 5 provided adjacent to the load-lock chamber 4 is constantly evacuated by a dry pump 15-2 and a turbomolecular pump 17-2 to enter a reduced pressure state in the order of $10^{-4}$ Pa. After evacuating the load-lock chamber 4 as described above, a partition wall (door valve 13-2) between the load-lock chamber 4 and the vacuum sample chamber 5 is opened, and the wafer 7 is held from the placement table 12 to a wafer holder 18 by a transport robot (not illustrated). The dry pump 15-1 and the turbomolecular pump 17-1 are vacuum pumps that evacuate the load-lock chamber 4, and the dry pump 15-2 and the turbomolecular pump 17-2 are vacuum pumps that evacuate the vacuum sample chamber 5.

The optical system lens barrel 6 is provided in the vacuum sample chamber 5. An electron beam emitted from an electron source 19 provided in an upper portion of the optical system lens barrel 6 is focused by an objective lens 20 such that the wafer 7 is irradiated with the focused electron beam. Due to the irradiation with the electron beam, secondary electrons are emitted from the vicinity of the surface of the wafer 7. The secondary electrons are guided to a secondary electron detector (not illustrated). The electron beam with which the wafer 7 is irradiated is deflected in a horizontal direction and a vertical direction for scanning to obtain a two-dimensional image. Based on the two-dimensional image, the control device 10 inspects and/or measures a line width of a circuit pattern, a dimension of a contact hole, or the like formed on the surface of the wafer 7. An X-Y stage 21 is provided below the wafer holder 18 that holds the wafer 7. The X-Y stage 21 moves the wafer 7 in the horizontal direction and the vertical direction such that inspection and/or measurement of a designated position of the surface of the wafer 7 is executed.

After completion of the inspection and/or the measurement of the wafer 7, the wafer 7 is unloaded from the vacuum sample chamber 5. At this time, the load-lock chamber 4 is in a reduced pressure state, and the door valve 13-2 is opened. The transport robot (not illustrated) loads the wafer 7 from the vacuum sample chamber 5 into the load-lock chamber 4 and places the wafer 7 on the placement table 12. Next, the door valve 13-2 is closed, and the following operation is executed to adjust the load-lock chamber 4 to be in the atmospheric pressure state. First, the valve 16-3 that has been opened to adjust the load-lock chamber 4 to be in the reduced pressure state is closed. At this time, the valve 16-1 is closed. Next, a valve 22 for introducing dry nitrogen that is provided in a pipe for introducing dry nitrogen into the load-lock chamber 4 is opened. As a result, dry nitrogen is introduced into the load-lock chamber 4 until the load-lock chamber 4 is in the atmospheric pressure. The valve 22 for introducing dry nitrogen is a part of a nitrogen supply line for supplying nitrogen to the load-lock chamber 4. The valve 22 for introducing dry nitrogen may be provided in the vacuum sample chamber 5 or may be provided in both of the load-lock chamber 4 and the vacuum sample chamber 5. When the wafer 7 is unloaded from the load-lock chamber 4, the door valve 13-1 is opened, and the transport robot 3 returns the wafer 7 to the FOUP 8.

This way, the wafer 7 is introduced from the FOUP 8 into the vacuum sample chamber 5 through the load-lock chamber 4. The wafer 7 that is inspected and/or measured in the vacuum sample chamber 5 returns from the vacuum sample chamber 5 to the FOUP 8 through the load-lock chamber 4.

As illustrated in FIG. 2, in the load-lock chamber 4, a static charge eliminator 23-1 that eliminates charge in foreign matter attached to an inner wall of the load-lock chamber 4 is provided. In addition, in the vacuum sample chamber 5, a static charge eliminator 23-2 that eliminates charge in foreign matter attached to an inner wall of the vacuum sample chamber 5 is provided. In the first embodiment, the static charge eliminators 23-1 and 23-2 are provided in the load-lock chamber 4 and the vacuum sample chamber 5, respectively. One static charge eliminator may eliminate charge in foreign matter attached to the inner walls of both of the load-lock chamber 4 and the vacuum sample chamber 5. The static charge eliminators 23-1 and 23-2 may be existing static charge eliminators such as a corona discharge type, a VUV light source type, or an X-ray irradiation type. The static charge eliminators 23-1 and 23-2 are provided at positions where charge in foreign matter attached to the inner walls of the load-lock chamber 4 and the vacuum sample chamber 5 can be eliminated. As long as one static charge eliminator can eliminate charge in foreign matter attached to the inner walls of both of the load-lock chamber 4 and the vacuum sample chamber 5, one static charge eliminator may be provided.

FIG. 3 is a block diagram illustrating hardware of the control device according to the first embodiment. Next, the hardware configuration of the control device 10 will be described with reference to FIG. 3.

The control device 10 is a computer system and includes a processor 30, a main storage unit 31, an auxiliary storage unit 32, an input/output interface (hereinafter, the interface will be abbreviated as "I/F") 33, a communication I/F 34, and a bus 35 through which the respective modules are communicably connected to each other.

The processor 30 is a central processing unit that controls the operations of the respective units of the control device 10. The processor 30 is, for example, a CPU (Central Processing Unit), a DSP (Digital Signal Processor), or an ASIC (Application Specific Integrated Circuit). The processor 30 loads a program stored in the auxiliary storage unit 32 to a work area of the main storage unit 31, and executes the loaded program. The main storage unit 31 temporarily stores the program to be executed by the processor 30, data to be processed by the processor, and the like. The main storage unit 31 is a flash memory, a RAM (Random Access Memory), or the like. The auxiliary storage unit 32 stores various programs (for example, an OS or a foreign matter discharge program) and various data. The auxiliary storage unit 32 is an HDD (Hard Disk Drive), an SSD (Solid State Disk), or the like. The input/output I/F 33 is an interface with the input/output device 11. The input/output device 11 includes an output device such as a display device and an input device such as a keyboard or a mouse. The communication I/F 34 is an interface with the load-lock chamber 4, the vacuum sample chamber 5, and the optical system lens barrel 6, and communicates with the load-lock chamber 4, the vacuum sample chamber 5, and the optical system lens barrel 6. A communication method of the communication I/F 34 may be wired communication or wireless communication.

FIG. 4 is a flowchart illustrating a foreign matter discharge method of discharging foreign matter attached to the inner walls of the load-lock chamber and the sample chamber according to the first embodiment. The control device 10 that is the computer system executes each of steps of the flowchart of FIG. 4 by executing the foreign matter discharge program stored in the auxiliary storage unit 32. The flowchart of FIG. 4 is executed, for example, at a timing at which the wafer 7 is unloaded from the load-lock chamber 4 and the vacuum sample chamber 5.

The control device 10 controls the operations of the static charge eliminators 23-1 and 23-2 to eliminate charge in foreign matter attached to the inner walls of the load-lock chamber 4 and the vacuum sample chamber 5 (Step S401). As a result, foreign matter 24 is likely to be separated from the inner wall. Next, the control device 10 controls the operation of the valve 22 for introducing dry nitrogen to introduce dry nitrogen into the load-lock chamber 4 and the vacuum sample chamber 5 such that the load-lock chamber 4 and the vacuum sample chamber 5 are in the atmospheric pressure state (Step S402). Immediately after adjusting the load-lock chamber 4 and the vacuum sample chamber 5 to be in the atmospheric pressure state, the control device 10 controls the operations of the valves 16-1 to 16-3, the dry pump 15-1, and the turbomolecular pump 17-1 to evacuate the load-lock chamber 4 and the vacuum sample chamber 5 (Step S403). Due to an air flow generated by the evacuation, the foreign matter 24 from which charge is eliminated is separated from the wall surface and is discharged from the exhaust port 14 together with the dry nitrogen. The control device 10 determines whether the number of times of evacuation executed in Step S403 reaches a set value (Step S404). When the number of times of evacuation executed does not reach the set value (Step S404: No), the control device 10 repeatedly executes the evacuation until the set value is reached. The set value is an integer of 1 or more. By repeating the introduction of dry nitrogen (Step S402) and the evacuation (Step S403), the foreign matter 24 attached to the inner walls of the load-lock chamber 4 and the vacuum sample chamber 5 can be effectively discharged to the outside of the apparatus. The charge elimination (Step S401), the introduction of dry nitrogen (Step S402), and the evacuation (Step S403) may be repeatedly executed. In addition, the evacuation (Step S403) may be repeatedly executed after the charge elimination (Step S401) and the introduction of dry nitrogen (Step S402). In addition, the charge elimination (Step S401) and the introduction of dry nitrogen (Step S402) may be executed in this order, and the introduction of dry nitrogen (Step S402) and the charge elimination (Step S401) may be executed in this order.

In addition, in the first embodiment, the cleaning of both of the load-lock chamber 4 and the vacuum sample chamber 5 is executed (the charge elimination (Step S401), the introduction of dry nitrogen (Step S402), and the evacuation (Step S403)). However, the cleaning of only the load-lock chamber 4 may be executed or the cleaning of only the vacuum sample chamber 5 may be executed.

In addition, the control device 10 controls the door valve 13-2 to close a gap between the load-lock chamber 4 and the vacuum sample chamber 5 and to individually execute the cleaning of the load-lock chamber 4 and the cleaning of the vacuum sample chamber 5.

Effect of First Embodiment

By executing the charge elimination (Step S401), the introduction of dry nitrogen (Step S402), and the evacuation (Step S403) illustrated in the flowchart of FIG. 4, the inside of the load-lock chamber 4 and the vacuum sample chamber 5 can be constantly maintained in a clean state, and the possibility of attachment of the foreign matter 24 to the wafer 7 can be reduced.

In addition, by repeatedly executing the charge elimination (Step S401), the introduction of dry nitrogen (Step S402), and the evacuation (Step S403), the inside of the load-lock chamber 4 and the vacuum sample chamber 5 can be maintained in a clean state.

The door valve 13-2 is controlled to close a gap between the load-lock chamber 4 and the vacuum sample chamber 5 and to individually execute the cleaning of the load-lock chamber 4 and the cleaning of the vacuum sample chamber 5 such that each of the chambers can be maintained in a clean state. As a result, the possibility of attachment of the foreign matter 24 to the wafer 7 in both of the load-lock chamber 4 and the vacuum sample chamber 5 can be reduced.

Second Embodiment

In order to maintain the inside of the load-lock chamber 4 and the vacuum sample chamber 5 in a clean state, it is desired to execute the flowchart of FIG. 4 at a high frequency. However, when the flowchart of FIG. 4 is executed, it is necessary to stop the inspection and/or the measurement in the semiconductor measurement and inspection apparatus 1. Therefore, when the flowchart of FIG. 4 is executed at a high frequency, the throughput decreases.

Accordingly, in a second embodiment, the target is limited to only the load-lock chamber 4 as one method of suppressing a decrease in throughput and maintaining the inside of the semiconductor measurement and inspection apparatus 1 in a clean state at a high frequency. In the second embodiment, the charge elimination, the introduction of dry nitrogen, and the evacuation of the vacuum sample chamber 5 are not executed.

In a typical operation of introducing the wafer 7 into the vacuum sample chamber 5, the introduction of dry nitrogen and the evacuation are executed in the load-lock chamber 4 in a state where the wafer 7 is loaded. In the load-lock chamber 4, due to an air flow generated by the introduction of dry nitrogen and the evacuation, the foreign matter 24 in the load-lock chamber 4 is likely to be whirled up, and the risk of attachment the whirled foreign matter 24 to the wafer 7 is high.

In addition, the load-lock chamber 4 has a lower volume than the vacuum sample chamber 5, and thus the introduction of dry nitrogen and the evacuation can be executed within a short period of time. Therefore, a decrease in throughput can be suppressed.

Therefore, in the second embodiment, by limiting the target to only the load-lock chamber 4 and cleaning the load-lock chamber 4 at a high frequency, the risk of attachment of the foreign matter 24 to the wafer 7 can be reduced while suppressing a decrease in throughput.

FIG. 5 is a flowchart illustrating a method of removing foreign matter attached to the inner wall of the load-lock chamber according to the second embodiment. In the second embodiment, whenever the number of the processed wafers 7 (number of counts) reaches 300, the cleaning of the load-lock chamber 4 is executed. The number 300 is exemplary, and the execution timing of cleaning can be set on a GUI of the input/output device 11. The same description as that of the first embodiment will not be repeated.

When the control device 10 determines that the number of the processed wafers 7 reaches the specified value (in FIG. 5, 300) (Step S501: Yes), the control device 10 stops loading the next wafer 7 into the load-lock chamber 4 and executes the cleaning of the load-lock chamber 4. The cleaning of the load-lock chamber 4 includes the charge elimination in foreign matter attached to the inner wall of the load-lock chamber 4 (Step S502), the introduction of dry nitrogen into the load-lock chamber 4 (Step S503), and the evacuation of the load-lock chamber 4 (Step S504).

When the number of times of evacuation of the load-lock chamber 4 reaches the set value (Step S505: Yes), the control device 10 resets the count value representing the number of the processed wafers 7 (Step S506), restarts loading the wafer 7 (Step S507), increments the count value (Step S508), and starts inspection and/or measurement of the wafer 7 in the vacuum sample chamber 5 (Step S509). The inspected and/or measured wafer 7 returns to the FOUP 8 (Step S510). Until the number of times of evacuation of the load-lock chamber 4 reaches the set value (S505: No), the charge elimination in foreign matter attached to the inner wall of the load-lock chamber 4 (Step S502), the introduction of dry nitrogen into the load-lock chamber 4 (Step S503), and the evacuation of the load-lock chamber 4 (Step S504) are repeated. Here, the introduction of dry nitrogen into the load-lock chamber 4 (Step S503) and the evacuation of the load-lock chamber 4 (Step S504) may be repeated without executing the charge elimination in foreign matter (Step S502).

When an accumulation speed of foreign matter in the load-lock chamber 4 is fast, the cleaning may be set to be executed at a shorter time interval than the above-described interval on the GUI. In the second embodiment, the execution timing of cleaning is determined based on the number of the processed wafers 7, but the execution timing of cleaning may be determined based on an elapsed time from the execution of the previous cleaning. That is, when the elapsed time from the execution of the previous cleaning reaches a specified value, the next cleaning is executed.

Effect of Second Embodiment

In the second embodiment, the cleaning the load-lock chamber 4 and the vacuum sample chamber 5 can be executed at a timing designated by a user. Accordingly, the cleaning of the load-lock chamber 4 and the vacuum sample chamber 5 can be executed certain timing in consideration of the accumulation speed of foreign matter in the load-lock chamber 4 or the vacuum sample chamber 5.

Third Embodiment

In the first and second embodiments, the inspection and/or the measurement of the wafer 7 is stopped to execute the cleaning of the load-lock chamber 4 or the vacuum sample chamber 5. The cleaning of only the load-lock chamber 4 is executed in parallel with the inspection and/or the measurement of the wafer 7. In the third embodiment, the cleaning of the load-lock chamber 4 is executed during a process of the inspection and/or the measurement of the wafer 7.

FIG. 6 is a flowchart illustrating a method of removing foreign matter attached to the inner wall of the load-lock chamber according to the third embodiment. In the third embodiment, the cleaning of the load-lock chamber 4 is incorporated into a series of processes of the inspection and/or the measurement of the wafer 7. The same description as that of the first and second embodiments will not be repeated.

The control device 10 controls the operation of the transport robot 3 to load the wafer 7 into the load-lock chamber 4 and to place the wafer 7 on the placement table 12 (Step S601). Next, the control device 10 controls the operations of the valves 16-1 to 16-3, the dry pump 15-1, and the turbomolecular pump 17-1 to evacuate the load-lock chamber 4 (Step S602). The control device 10 controls the operation of the transport robot (not illustrated) to load the wafer 7 into the vacuum sample chamber 5 (Step S603). The wafer 7 is held on the wafer holder 18 of the vacuum sample chamber 5. The control device 10 controls the operation of the optical system lens barrel 6 to inspect and/or to measure a line width of a circuit pattern, a dimension of a contact hole, or the like formed on the surface of the wafer 7 (Step S604).

In the third embodiment, while inspecting and/or measuring the wafer 7, the cleaning of the load-lock chamber 4 (the charge elimination in foreign matter attached to the inner wall of the load-lock chamber 4 (Step S605), the introduction of dry nitrogen into the load-lock chamber 4 (Step S606), and the evacuation of the load-lock chamber 4 (Step S607)) is executed. When the number of times of evacuation of the load-lock chamber 4 reaches the specified value (Step S608: Yes), the control device 10 waits until the inspection and/or the measurement of the wafer 7 ends (Step S609).

In the third embodiment, while executing the inspection and/or the measurement of the wafer 7, the cleaning of the load-lock chamber 4 is executed the specified number of times. However, the specified number of times may be variable. For example, an end time of the inspection and/or the measurement of the wafer 7 may be predicted such that the cleaning of the load-lock chamber 4 is repeatedly executed until the end time is reached. In addition, the cleaning of the load-lock chamber 4 may be repeatedly executed until the process proceeds to a predetermined step of the inspection and/or the measurement of the wafer 7.

When the inspection and/or the measurement of the wafer 7 is completed (Step S610), the control device 10 controls the operation of the transport robot (not illustrated) to load the wafer 7 into the load-lock chamber 4 and to place the wafer 7 on the placement table 12 (Step S611). The control device 10 controls the operation of the transport robot 3 to unload the wafer 7 from the load-lock chamber 4 and to return the wafer 7 to the FOUP 8 through the EFEM 9 (Step S612).

Effect of Third Embodiment

In the third embodiment, the cleaning of the load-lock chamber 4 can be executed while inspecting and/or measuring the wafer 7. That is, the cleaning of the load-lock chamber 4 can be executed while preventing a decrease in throughput.

Fourth Embodiment

In addition, by providing a plurality of (in a fourth embodiment, two) the load-lock chambers 4, a decrease in throughput can also be prevented. FIG. 7 is a top view illustrating an overall configuration of a semiconductor measurement and inspection apparatus including the plurality of load-lock chambers according to the fourth embodiment. As illustrated in FIG. 7, the semiconductor measurement and inspection apparatus 1 according to the fourth embodiment includes the load-lock chamber 4 and a load-lock chamber 4-2. In the fourth embodiment, by alternately using the load-lock chamber 4-2 and the load-lock chamber 4 to clean the load-lock chamber that is not being used, a decrease in throughput is prevented.

FIG. 8 is a flowchart illustrating a method of removing foreign matter attached to inner walls of the plurality of load-lock chambers according to the fourth embodiment. The same description as that of the first to third embodiments will not be repeated.

The control device 10 loads the wafer 7 into the load-lock chamber 4 (Step S801), and loads the wafer 7 loaded into the load-lock chamber 4 into the vacuum sample chamber 5 (Step S802). The control device 10 inspects and/or measures the wafer 7 (Step S803). While inspecting and/or measuring the wafer 7, the cleaning of the load-lock chamber 4 (the charge elimination in foreign matter attached to the inner wall of the load-lock chamber 4 (Step S804), the introduction of dry nitrogen into the load-lock chamber 4 (Step 805), and the evacuation of the load-lock chamber 4 (Step S806)) is repeatedly executed (Step S807).

In parallel with the use of the load-lock chamber 4, the control device 10 may repeatedly execute the cleaning of the load-lock chamber 4-2 (the charge elimination in foreign matter attached to the inner wall of the load-lock chamber 4-2 (Step S808), the introduction of dry nitrogen into the load-lock chamber 4-2 (Step 809), and the evacuation of the load-lock chamber 4-2 (Step S810)) (Step S811).

The control device 10 loads the next wafer 7-2 to be inspected and/or measured into the load-lock chamber 4-2 (Step S812). The control device 10 controls the operation of the transport robot (not illustrated) to replace the inspected and/or measured wafer 7 with the wafer 7-2 loaded into the load-lock chamber 4-2 (Step S813). The control device 10 controls the operation of the transport robot 3 to return the inspected and/or measured wafer 7 from the load-lock chamber 4-2 to the FOUP 8 (Step S814). The control device 10 controls the operation of the transport robot (not illustrated) to introduce the wafer 7-2 into the vacuum sample chamber 5 and to inspect and/or measure the wafer 7-2.

Effect of Fourth Embodiment

In the fourth embodiment, in parallel with the process of the wafer in the load-lock chamber 4 that is being used, the cleaning of the load-lock chamber 4-2 that is not being used can be executed. That is, the cleaning of the load-lock chamber 4 and the load-lock chamber 4-2 can be alternately executed while preventing a decrease in throughput.

Fifth Embodiment

In the first to fourth embodiments, the cleaning of the load-lock chamber 4 or the vacuum sample chamber 5 is executed in a state where a wafer is not present in the chamber. In a fifth embodiment, the cleaning of the load-lock chamber 4 or the vacuum sample chamber 5 is executed in a state where a wafer is present in the chamber. The wafer used in the fifth embodiment is a bare wafer used for a particle check or the like, not a wafer for manufacturing a semiconductor device as a product. In the first to fourth embodiments, the foreign matter 24 is discharged from the exhaust port 14 to the outside of the apparatus. In the fifth embodiment, the foreign matter 24 is attached to a wafer 7-3 and discharges the foreign matter 24 to the outside of the apparatus together with the wafer 7-3.

FIG. 9 is a cross-sectional view illustrating a load-lock chamber into which a wafer is loaded in the fifth embodiment. As illustrated in FIG. 9, the wafer 7-3 to which the foreign matter 24 is not attached is prepared, and this wafer 7-3 is loaded into the load-lock chamber 4. In a state where the wafer 7-3 is loaded into the load-lock chamber 4, the series of operations of the cleaning of the load-lock chamber 4 (the charge elimination in foreign matter attached to the inner wall, the introduction of dry nitrogen, and the evacuation) is repeated to attach the foreign matter 24 separated from the inner wall to the wafer 7-3. The wafer 7-3 to which the foreign matter 24 is attached returns to the FOUP 8. In the fifth embodiment, the foreign matter 24 attached to the inner wall of the load-lock chamber 4 is discharged to the outside of the apparatus together with the wafer 7-3. However, the foreign matter attached to the inner wall of the vacuum sample chamber 5 may be discharged to the outside of the apparatus together with the wafer 7-3.

Effect of Fifth Embodiment

In the fifth embodiment, the foreign matter 24 attached to the inner wall of the load-lock chamber 4 can be discharged to the outside of the apparatus together with the wafer 7-3.

The present disclosure is not limited to the embodiments described above and includes various modification examples. For example, the embodiments have been described in detail in order to describe the present disclosure in an easy-to-understand manner, and the present invention is not necessarily to include all the configurations described above. In addition, addition, deletion, and replacement of another configuration can be made for a part of the configuration of each of the embodiments. In addition, some or all of the above-described respective configurations, functions, processing units, processing means, and the like may be implemented by hardware, for example, by designing an integrated circuit. In addition, the respective configurations, functions, and the like may be implemented by software by a processor interpreting and executing a program that realizes each of the functions. Information of a program, a table, a file, or the like that implements each of the functions can be stored in a recording device such as a memory, a hard disk, or an SSD (Solid State Drive) or a recording medium such as an IC card, an SD card, or a DVD.

For example, in the first to fifth embodiments, the example where foreign matter attached to the inner wall of the load-lock chamber 4 or the vacuum sample chamber 5 in the semiconductor measurement and inspection apparatus 1 that inspects and/or measures a wafer is discharged to the outside of the apparatus is described. However, the present disclosure is not limited to the semiconductor measurement and inspection apparatus as long as it is a vacuum processing apparatus that processes a sample in a vacuum, and is applicable to an apparatus such as an ion implantation apparatus that implants ions into a wafer, an inspection apparatus that inspects micro foreign matter or defects present on a wafer, a cleaning apparatus that cleans micro foreign matter or contaminants on a wafer, an oxide film forming apparatus that forms an oxide film on a wafer surface, a pattern transfer apparatus that transfers a mask pattern to a wafer, an etching apparatus that prepares a wiring or the like by etching through a pattern as a mask, or a thin film forming apparatus that covers a wiring with an insulating film for separation for each layer.

REFERENCE SIGNS LIST

1: semiconductor measurement and inspection apparatus
2: FOUP rotor
3: transport robot
4, 4-2: load-lock chamber
5: vacuum sample chamber
6: optical system lens barrel
7, 7-2, 7-3: wafer
8: FOUP
9: EFEM
10: control device
11: input/output device
12: placement table
13-1, 13-2: door valve
14: exhaust port
15-1, 15-2: dry pump
16-1, 16-2, 16-3: valve
17-1, 17-2: turbomolecular pump
18: wafer holder
19: electron source
20: objective lens
21: X-Y stage
22: valve for introducing dry nitrogen
23-1, 23-2: static charge eliminator
24: foreign matter

The invention claimed is:

1. A foreign matter discharge method of discharging foreign matter in vacuum processing apparatus including a vacuum sample chamber where a sample is processed in a vacuum and a preliminary exhaust chamber into which the sample is loaded before being transported to the vacuum sample chamber, the foreign matter discharge method comprising:

allowing a static charge eliminator to eliminate charge in foreign matter attached to an inner wall of at least one of the preliminary exhaust chamber or the vacuum sample chamber;

allowing a nitrogen supply line to supply nitrogen to the preliminary exhaust chamber and the vacuum sample chamber; and allowing a vacuum pump to evacuate the preliminary exhaust chamber and the vacuum sample chamber, wherein when the number of counts of the processed samples reaches a specified value or when an elapsed time from the charge elimination in the foreign matter, the nitrogen supply, and the evacuation that are previously executed reaches a specified value, the charge elimination in the foreign matter attached to the inner wall, the nitrogen supply, and the evacuation in at least one of the preliminary exhaust chamber or the vacuum sample chamber are executed.

2. A foreign matter discharge method of discharging foreign matter in vacuum processing apparatus including a vacuum sample chamber where a sample is processed in a vacuum and a preliminary exhaust chamber into which the sample is loaded before being transported to the vacuum sample chamber, the foreign matter discharge method comprising:

allowing a static charge eliminator to eliminate charge in foreign matter attached to an inner wall of at least one of the preliminary exhaust chamber or the vacuum sample chamber;

allowing a nitrogen supply line to supply nitrogen to the preliminary exhaust chamber and the vacuum sample chamber; and allowing a vacuum pump to evacuate the preliminary exhaust chamber and the vacuum sample chamber, wherein the vacuum processing apparatus further includes another preliminary exhaust chamber into which the sample is loaded before being transported to the vacuum sample chamber, and wherein the charge elimination in the foreign matter attached to the inner wall, the nitrogen supply, and the evacuation in the other preliminary exhaust chamber are executed during use of the preliminary exhaust chamber.

3. A foreign matter discharge method of discharging foreign matter in vacuum processing apparatus including a vacuum sample chamber where a sample is processed in a vacuum and a preliminary exhaust chamber into which the sample is loaded before being transported to the vacuum sample chamber, the foreign matter discharge method comprising:

allowing a static charge eliminator to eliminate charge in foreign matter attached to an inner wall of at least one of the preliminary exhaust chamber or the vacuum sample chamber;

allowing a nitrogen supply line to supply nitrogen to the preliminary exhaust chamber and the vacuum sample chamber; and allowing a vacuum pump to evacuate the preliminary exhaust chamber and the vacuum sample chamber, wherein an operation of a partition wall between the vacuum sample chamber and the preliminary exhaust chamber is controlled to close a gap between the vacuum sample chamber and the preliminary exhaust chamber, the charge elimination in the foreign matter attached to the inner wall, the nitrogen supply, and the evacuation in the preliminary exhaust chamber are executed, and the charge elimination in the foreign matter attached to the inner wall, the nitrogen supply, and the evacuation in the vacuum sample chamber are executed.

4. The foreign matter discharge method according to claim 3, wherein at least one of the nitrogen supply to the preliminary exhaust chamber and the vacuum sample chamber or the evacuation of the preliminary exhaust chamber and the vacuum sample chamber is repeatedly executed.

5. The foreign matter discharge method according to claim 3, wherein after the charge elimination in the foreign matter attached to the inner wall, the nitrogen supply, and the evacuation in the preliminary exhaust chamber are executed in a state where the sample is loaded into the preliminary exhaust chamber, the sample is unloaded from the preliminary exhaust chamber.

6. The foreign matter discharge method according to claim 3, wherein the charge elimination in the foreign matter attached to the inner wall, the nitrogen supply, and the evacuation in the preliminary exhaust chamber executed during a process of the sample in the vacuum sample chamber.

7. The foreign matter discharge method according to claim 6, wherein the charge elimination in the foreign matter attached to the inner wall, the nitrogen supply, and the evacuation in the preliminary exhaust chamber are repeatedly executed during the process of the sample in the vacuum sample chamber.

8. A vacuum processing apparatus comprising, a transport unit configured to transport a sample;

a vacuum sample chamber where the sample is processed in a vacuum;

a preliminary exhaust chamber into which the sample is loaded before being transported to the vacuum sample chamber;

a static charge eliminator configured to eliminate charge in foreign matter attached to an inner wall of at least one of the preliminary exhaust chamber of the vacuum sample chamber;

a nitrogen supply line configured to supply nitrogen to the preliminary exhaust chamber and the vacuum sample chamber;

a vacuum pump configured to evacuate the preliminary exhaust chamber and the vacuum sample chamber; and a computer system configured to control the transport unit the static charge eliminator, the vacuum pump, and the nitrogen supply line to execute the charge elimination in the foreign matter attached to the inner wall, the nitrogen supply, and the evacuation in at least one of the preliminary exhaust chamber or the vacuum sample chamber, wherein when the number of counts of the processed samples reaches a specified value or when an elapsed time from the charge elimination in the foreign matter, the nitrogen supply, and the evacuation that are previously executed reaches a specified value, the computer system executes the charge elimination in the foreign matter attached to the inner wall, the nitrogen supply, and the evacuation in at least one of the preliminary exhaust chamber or the vacuum sample chamber.

9. A vacuum processing apparatus comprising:

a transport unit configured to transport a sample;

a vacuum sample chamber where the sample is processed vacuum;

a preliminary exhaust chamber into which the sample is loaded before being transported to the vacuum sample chamber;

a static charge eliminator configured to eliminate charge in foreign matter attached to an inner wall of at least one of the preliminary exhaust chamber or the vacuum sample chamber;

a nitrogen supply line configured to supply nitrogen to the preliminary exhaust chamber and the vacuum sample chamber;

a vacuum pump configured to evacuate the preliminary exhaust chamber and the vacuum sample chamber;

a computer system configured to control the transport unit, the static charge eliminator, the vacuum pump, and the nitrogen supply line to execute the charge elimination in the foreign matter attached to the inner wall, the nitrogen supply, and the evacuation in at least one of the preliminary exhaust chamber or the vacuum sample chamber; and another preliminary exhaust chamber into which the sample is loaded before being transported to the vacuum sample chamber, wherein the computer system executes the charge elimination in the foreign matter attached to the inner wall, the nitrogen supply, and the evacuation in the other preliminary exhaust chamber during use of the preliminary exhaust chamber.

10. A vacuum processing apparatus comprising a transport unit configured to transport a sample:

a vacuum sample chamber where the sample is processed in a vacuum;

a preliminary exhaust chamber into which the sample is loaded before being transported to the vacuum sample chamber;

a static charge eliminator configured to eliminate charge in foreign matter attached to an inner wall of at least one of the preliminary exhaust chamber or the vacuum sample chamber;

a nitrogen supply line configured to supply nitrogen to the preliminary exhaust chamber and the vacuum sample chamber;

a vacuum pump configured to evacuate the preliminary exhaust chamber and the vacuum sample chamber;

a computer system configured to control the transport unit, the static charge eliminator, the vacuum pump, and the nitrogen supply line to execute the charge elimination in the foreign matter attached to the inner wall, the nitrogen supply, and the evacuation in at least one of the preliminary exhaust chamber or the vacuum sample chamber; and a partition wall between the vacuum sample chamber and the preliminary exhaust chamber, wherein the computer system controls an operation of the partition wall to close a gap between the vacuum sample chamber and the preliminary exhaust chamber, executes the charge elimination in the foreign matter attached to the inner wall, the nitrogen supply, and the evacuation in the preliminary exhaust chamber, and executes the charge elimination in the foreign matter attached to the inner wall, the nitrogen supply, and the evacuation in the vacuum sample chamber.

11. The vacuum processing apparatus according to claim 10, wherein the computer system repeatedly executes the nitrogen supply and the evacuation in at least one of the preliminary exhaust chamber or the vacuum sample chamber.

12. The vacuum processing apparatus according to claim 10, wherein after the computer system executes the charge elimination in the foreign matter attached to the inner wall, the nitrogen supply, and the evacuation in the preliminary exhaust chamber in a state where the sample is loaded into the preliminary exhaust chamber, the sample is unloaded from the preliminary exhaust chamber.

13. The vacuum processing apparatus according to claim 10, wherein the computer system executes the charge elimination in the foreign matter attached to the inner wall, the nitrogen supply, and the evacuation in the preliminary exhaust chamber during a process of the sample in the vacuum sample chamber.

14. The vacuum processing apparatus according to claim 13, wherein the computer system repeatedly executes the charge elimination in the foreign matter attached to the inner wall, the nitrogen supply, and the evacuation in the preliminary exhaust chamber during a process of the sample in the vacuum sample chamber.

* * * * *